United States Patent [19]

Piber

[11] Patent Number: 4,937,705

[45] Date of Patent: Jun. 26, 1990

[54] VARIABLE POWER CONTROL APPARATUS HAVING EXTERNAL HEAT SINK MOUNTING BATTERY CLIPS

[75] Inventor: Earl T. Piber, Oconomowoc, Wis.

[73] Assignee: Eaton Corporation, Cleveland, Ohio

[21] Appl. No.: 348,545

[22] Filed: May 8, 1989

[51] Int. Cl.[5] .................... H05K 7/20

[52] U.S. Cl. .................... 361/388; 174/16.3; 363/141; 165/80.1

[58] Field of Search .................... 361/379, 383, 386–388; 174/16.3; 363/141; 165/80.1, 80.2, 80.3

[56] References Cited

U.S. PATENT DOCUMENTS

| | | | |
|---|---|---|---|
| 4,205,434 | 6/1980 | Brozoski et al. | 361/386 |
| 4,222,090 | 9/1980 | Jaffe | 361/386 |
| 4,586,777 | 5/1986 | Wied, deceased | 339/154 A |
| 4,665,290 | 5/1987 | Piber | 200/303 |
| 4,719,395 | 1/1988 | Aoi et al. | 318/349 |

OTHER PUBLICATIONS

Eatpn Drawing D90–14199.

*Primary Examiner*—Roy N. Envall, Jr.
*Attorney, Agent, or Firm*—L. G. Vande Zande

[57] ABSTRACT

A U-shaped or O-shaped metal strap (20, 30–32, 34) is attached in a belt-like manner around the insulating housing (2, 2') of a DC speed control switch to provide an external heat sink for a FET (22, 36) attached to the heat sink. Bosses (**2*f*, 2*h*, 2*g*) on the switch housing project into holes (20*e*, 20*b*–32*b*, 34*h*, 34*g*) in the heat sink to position the heat sink on the housing. Formed terminal conductors on the FET plug into press-in terminations on the switch. A pair of mirror image battery clips (16) are trapped against opposite sides of the switch housing by the heat sink and an interposed insulator (18), the clips having cooperatively aligned depending legs (16*e*) forming battery terminal clips, and formed prongs (16*c*) that plug into press-in wire terminations on the switch. Holes (16*d*) in body portions of the battery clips surround bosses (2*e***) on the sides of the switch housing to interlock the clips against lateral movement.

19 Claims, 4 Drawing Sheets

VARIABLE POWER CONTROL APPARATUS HAVING EXTERNAL HEAT SINK MOUNTING BATTERY CLIPS

BACKGROUND OF THE INVENTION

This invention relates to electric switches for controlling power applied to a load wherein a heat sink is provided externally to the apparatus and has a power switching semiconductor of the apparatus attached thereto. More particularly, the invention relates to electric switches for controlling a motor of a portable electric tool. Still more particularly, the invention relates to electric switches for controlling the speed of a DC motor of a portable electric tool and to battery clip terminations of the electric switch to a battery supply.

Electric switches for controlling portable electric tools are provided in a large number of physical and functional variations due to diverse customer requirements. On the other hand, the overall package size and configuration and mounting features for securing the switch within the tool housing are somewhat standardized. To realize any economy of scale advantage in manufacturing switches to numerous variations, it is necessary to achieve as much commonality in parts as possible from one variation to another.

Electric switches of the foregoing type for controlling the speed of AC motors have long been available. Recently, battery powered DC tools have become prevalent. The switches for controlling the speed of DC motors in battery powered tools are required to have essentially the same configuration and general operating principles as the switches for controlling AC motors. Speed control switches tend to be compact, densely arranged with components and incorporate circuitry including a power switching semiconductor which generates significant heat that must be dissipated to prevent damage to the control and to the tool. Heat sink requirements often exceed the available space within the switch to the end that the semiconductor switching element is brought outside of the switch and attached to a portion of the tool housing, utilizing the tool housing as a heat sink. The control of DC motors for portable tools is essentially similar to that for AC controls, but discrete differences in the DC control generate greater heat to be dissipated to the extent that direct use of the tool housing as a heat sink is not feasible.

U.S. Pat. No. 4,719,395 issued Jan. 12, 1988 to Tatsuo Aoi et al discloses a DC speed control switch wherein a cover assembly of the switch housing per se is a heat sink. The cover assembly comprises an interior metal cover which attaches to the insulating switch base with a snap fit to overlie a printed circuit board and other electrical switch components disposed within the switch base. The power switching transistor is sandwiched between the interior metal cover and an exterior metal cover, clamped tightly therebetween by a screw. The exterior cover envelopes the interior cover and also snap attaches to the insulating switch base. This double formed cover arrangement, clamped around a semiconductor and each cover snapped to an insulating base, is complex and costly. Electrically conductive metal is used as a housing element as contrasted to insulative plastic materials prevalent in current technology to provide a fully insulated electrical switch housing. The particular cover arrangement of the aforementioned patent provides external heat sinking for the power switching semiconductor, but still locates the power switching semiconductor directly above the switch base cavity in close proximity to the printed circuit board and the electrical components of the switch.

Another concern in providing speed control switches for DC electric motors is the connection between the switch and the power source. In some devices, wires are utilized between the switch and a battery to provide a permanent connection. In other versions, a battery or a battery module is removable from the tool and the connection between the battery and the switch is broken upon removal. This connection is customarily a battery clip made a part of the switch. It is preferable and advantageous that the battery clip be an add-on structure which can readily convert a hard wire termination of a basic switch to a battery clip termination. U.S. Pat. No. 4,586,777 issued May 6, 1986 to Julius P. Wied discloses a battery clip adaptor which is snap-fit to a switch module. This adaptor comprises a plastic insulating base 10 to which are mounted separate pairs of clips and terminal prongs secured together and to the base by respective rivets the prongs extending into electrical contact with power terminals of the speed control switch when the adaptor base is snap-fit attached to the switch housing. The numerous discrete parts and riveting operations required to assemble the adaptor introduce a significant cost burden to the switch.

It is an object of this invention to provide a fully insulated speed control switch for a DC electric motor having an external heat sink attached around the insulating housing of the switch, or into which such insulating housing is nested, and to which a power switching semiconductor is directly attached.

It is a further object of this invention to provide an electric speed control switch for a DC motor having an external heat sink attached to an insulating housing of the switch and utilizing the heat sink as a clamping member for affixing battery clip terminals to the switch.

SUMMARY OF THE INVENTION

The control apparatus supplying variable electric power to a load of this invention comprises a speed control switch having an electrically insulating housing and an operator selectively movable over a range of positions to connect, disconnect or apply power to the load in response to a particular position of the operator, a heat sink comprising a metal band surrounding at least three sides of the switch housing, the heat sink being provided with attachment means which cooperate with respective means on the switch housing to retain the heat sink and switch housing assembled together. Electric battery clips are disposed between the heat sink and the insulating housing side walls and are interlocked to the side walls by cooperating formations on each member, the clips having preformed termination members engaging with power terminals of the switch and spring clips which depend in cooperative alignment to engage the terminals of a battery or battery pack.

The foregoing objects and the advantages achieved by this invention will become more readily apparent from the following description and claims when read in conjunction with the accompanying drawings.

DESCRIPTION OF THE PREFERRED EMBODIMENTS

Figure 1:
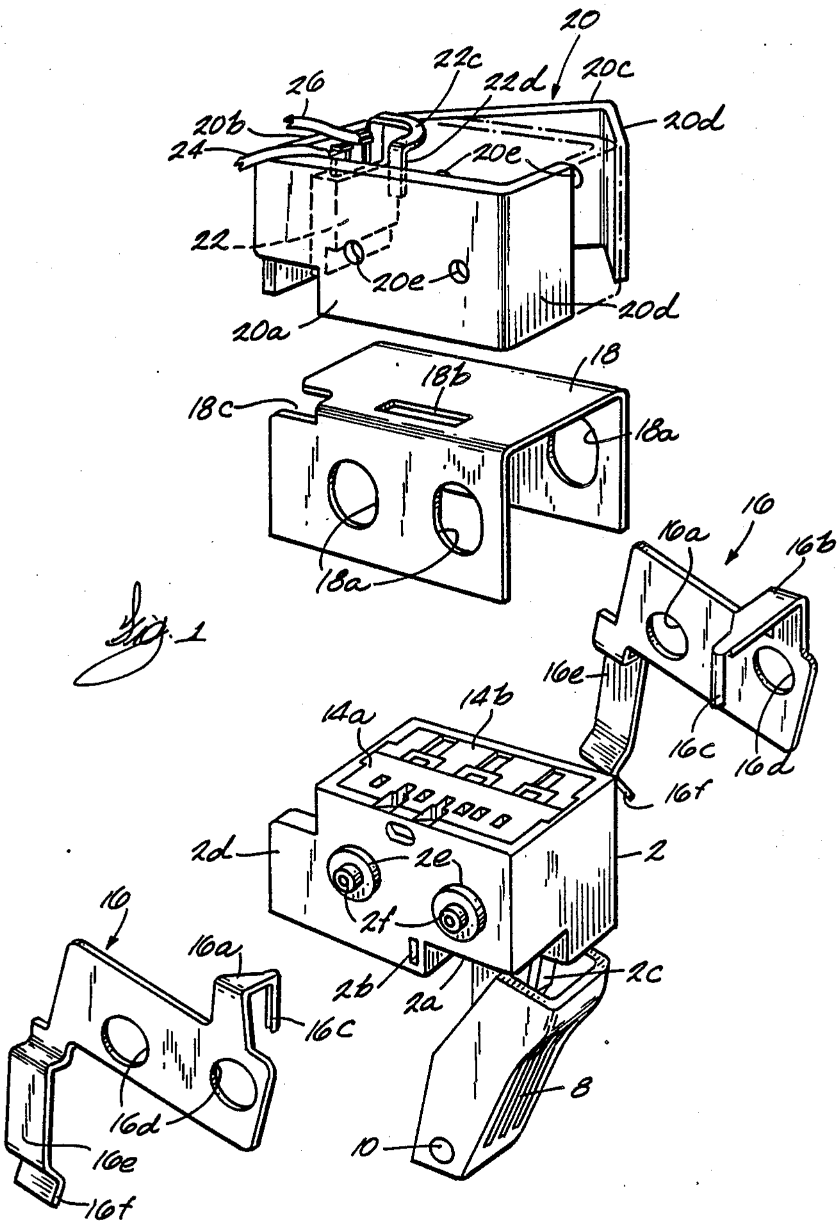
FIG. 1 is an exploded perspective view of the electric switch of this invention showing the heat sink, battery clips and an insulator member exploded from the speed control switch.

Referring to the drawings and particularly FIGS. 1-4, the switch of this invention comprises a rectangular, hollow box-like plastic insulating housing 2 open to the upper side thereof. A lower corner 2*a* of housing 2 is relieved to accommodate an operator shaft 4 extending into the housing 2 through an opening in the side wall thereof. An O-ring 6 surrounds operator 4 within a groove 2*b* (FIG. 1) of the housing to seal the switch against the ingress of foreign material. A column 2*c* depends from the housing 2 adjacent the relieved corner 2*a*. A generally U-shaped elongated trigger 8 is pivotally attached to the lowermost end of depending column 2*c* by a pin 10. A leaf spring 12 is inset in a slot in column 2*c* and bears against an internal surface of trigger 8 to bias the upper end of the trigger away from column 2*c*. Adjacent one side wall of trigger 8 at the top thereof is an upstanding arm 8*a* which has a vertically oriented slot 8*b* therein. Slot 8*b* is engaged around the pin 4*a* of a clevis 4*b* formed on the external end of operator shaft 4 to drive the operator axially inwardly of the switch housing upon depression of trigger 8 against column 2*c*.

The internal switching and speed control mechanism of the switch of this invention is essentially that disclosed in my U.S. Pat. No. 4,665,290 issued May 12, 1987 entitled "Trigger Operated Portable Electric Switch", assigned to the assignee of this invention, the disclosure of which is incorporated herein by reference. The numerous movable and stationary contacts, wiper blade contacts, resistors, printed circuit board and other elements of the switch are assembled within two electrically insulating hollow base halves 14*a* and 14*b* which are assembled together to have open sides mating and are subsequently inserted into the housing 2 through the open upper side. The operator connection with the movable contact carrier of the internal switching mechanism has been modified somewhat from that disclosed in the referenced patent to accommodate the different location and configuration of operator plunger 4 as compared to the inline sliding trigger disclosed in the patent, but that feature is not essential to an understanding of this invention and has not been shown. Base halves 14*a* and 14*b* have an interlocking structure along their adjacent edge to maintain the two base halves assembled tightly together against the bias applied by internal components, thereby relieving pressure from the side walls of insulating housing 2. Base half 14*a* also has a plurality of openings leading to internal press-in wire termination clips.

Insulating switch housing 2 is provided with a pair of lateral side wall extensions or heel portions 2*d* projecting rearwardly therefrom. Heels 2*d* define a protected open area therebetween in which a power switching semiconductor is disposed as will be described hereinafter. Switch housing 2 also has disc-shaped bosses 2*e* formed integrally on opposite side walls thereof. Bosses 2*e* are customarily provided for cooperation with structure in the tool housing for positioning or mounting the switch within that housing. In the specific embodiment of FIGS. 1-4, concentric reduced diameter integral bosses 2*f* project outwardly from the surface of bosses 2*e*.

A pair of battery terminal clips 16 are provided according to this invention. The clips 16 are essentially a mirror image of each other, different only in the particular shape, location and length of the arms 16*a* and 16*b* which support U-shaped depending prongs 16*c* from the distal ends thereof. The body of each respective clip 16 is provided with a pair of holes 16*d* which are complementally spaced and sized to be disposed over disc-like projections 2*e* when the respective clips are placed against the side surfaces of switch housing 2. In positioning the clips 16 against the respective sides of housing 2, prongs 16*c* are respectively inserted in the first two terminal openings adjacent the forward end of the switch to make connection with the power terminals of the switch. The rear end of each clip 16 has a depending leg 16*e* at the respective rear end thereof, and each leg has a V-shaped formation 16*f* at the distal end to serve as a battery terminal engaging portion of the clip.

A U-shaped Mylar sheet 18, best seen in FIG. 1, is disposed over switch housing 2 and the terminal clips 16 positioned thereagainst. Side legs of Mylar insulator 18 have holes 18*a* therein which are cooperatively aligned and sized to receive the bosses 2*e* therein when the insulator 18 is properly positioned. A rectangular opening 18*b* in the upper surface joining the side legs of insulator 18 overlies the third to sixth terminal opening of the base half 14*a* to provide access thereto. As seen in FIG. 1, an upper rear corner is notched at 18*c* to provide clearance for wires from the power switching semiconductor device as will be disclosed hereinafter.

A heat sink 20 comprising an essentially rectangular strap is attached to housing 2 to firmly trap battery clips 16 against the side surface of housing 2 and retain these clips securely fastened to the switch. In the embodiment shown in FIG. 1, the heat sink 20 comprises four walls 20*a*, 20*b*, 20*c* and 20*d* with the forward wall 20*d* being split essentially at its center. The wall 20*c*, which is contiguous with wall 20*b* and one portion of wall 20*d*, is bent angularly outward to open the heat sink sufficiently for assembling it over housing 2. Opposed side walls 20*a* and 20*c* contain holes 20*e* which are aligned with and sized to be complementary to the reduced diameter bosses 2*f*. Heat sink 20 is positioned over switch housing 2 such that the bosses 2*f* on the near side of switch housing 2 as viewed in FIG. 1 are engaged in openings 20*e* in wall 20*a*, whereupon wall 20*d* is bent inwardly to engage bosses 2*f* on the opposite side of switch housing 2 within openings 20*e* in wall 20*c*. The final position of wall 20*c* completes a rectangular belt-like enclosure around the sides of switch housing 2 to securely clamp the battery clips 16 against the side surfaces of the switch housing 2, the clips being prevented from sliding or rotating by openings 16*d* disposed over bosses 2*e*.

Figure 2:
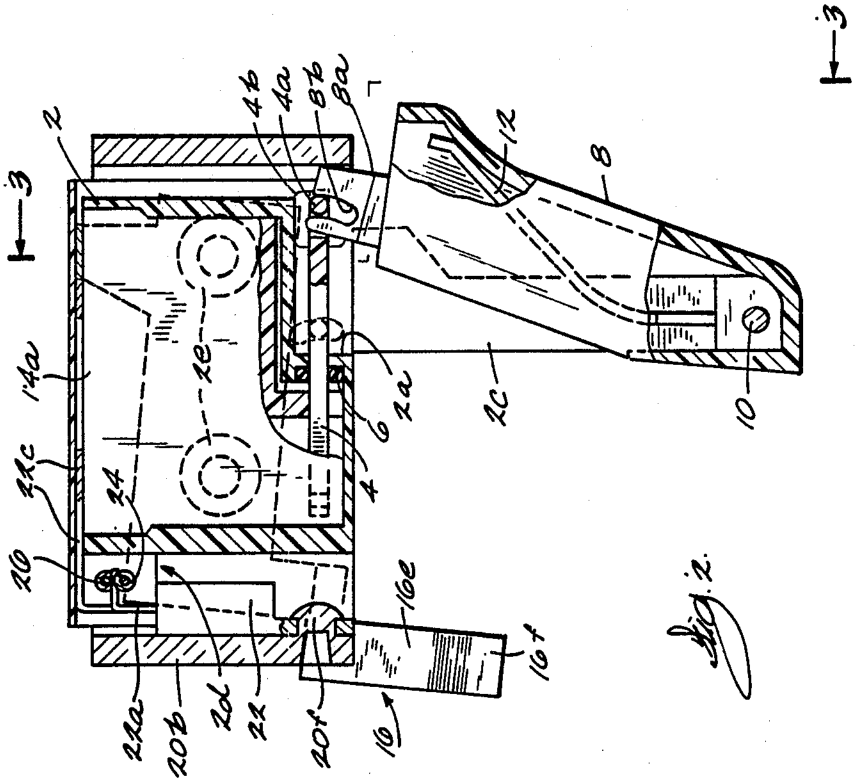
FIG. 2 is a sectional view taken substantially the line 2—2 of FIG. 3.
Figure 4:
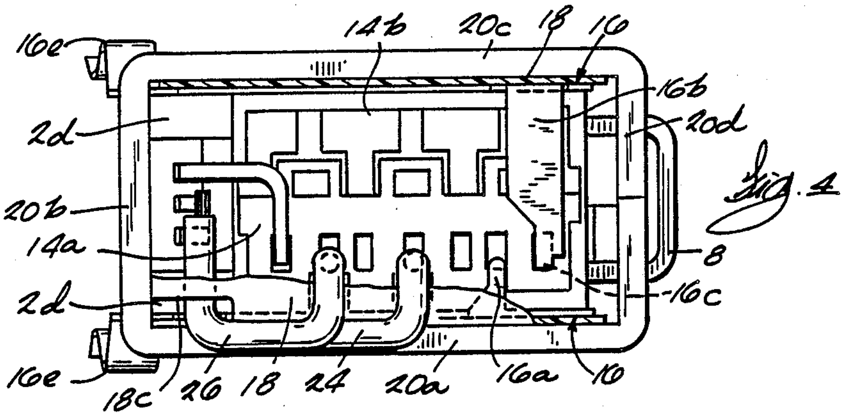
FIG. 4 is a top plan view of the switch of FIGS. 1-3 with a portion of an insulator broken away.

A power switching semiconductor such as FET 22 is secured against the internal surface of rear wall 20*b* such as by riveting over a projection 20*f* formed on the internal surface of rear wall 20*b* (FIG. 2). FET 22 is disposed between heel portions 2*d* when heat sink 20 is attached to housing 2. The FET 22 has three flat-bladed formed leads extending therefrom, two of which are coplanar and have insulated wires 24 and 26 soldered thereto. A third lead 22*c* is formed to extend forwardly and laterally, terminating in a depending prong 22*d* which is directly received in one of the wire termination openings in base half 14*a* upon attachment of the heat sink 20 to switch housing 2. The flexibility of Mylar insulator 18 permits one leg and the upper surface thereof to be held upwardly clear of switch housing 2 during attachment of the near side of heat sink 20 and the connection of prong 22*d* within the appropriate termination hole, and thereafter folded down across the top of the switch housing and along the opposite side thereof to protectively cover the lead 22*c*. Wires 24 and 26 are brought out through slot 18*c* in insulator 18 and opposite ends of the wires are inserted in respective wire terminal openings in base half 14*a* as seen in FIG. 4.

Heat sink 20 is preferably formed as a complete rectangle to maximize the heat sink area and mass. Wall 20*d* could be split at any point along its length, particularly near the corner adjacent wall 20*c*. However, greater rigidity and retention can be obtained by splitting the wall at the center and providing two internal corners for gripping the housing 2. Moreover, with a suitable choice of material, wall 20*d* could be omitted completely leaving a U-shaped heat sink formed by walls 20*a*, 20*b* and 20*c*. In such version, wall 20*c* would preferably be formed in the final position and the heat sink would be of a material capable of being sprung outwardly during assembly and returning to its final position when released.

Figure 5:
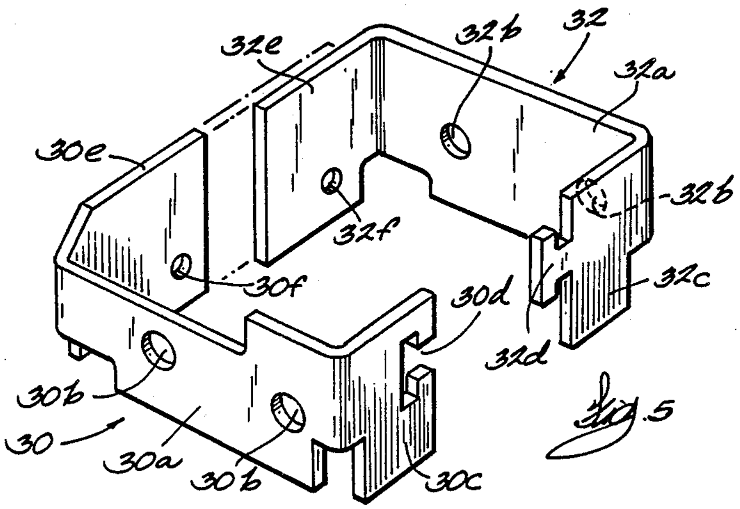
FIG. 5 is an exploded perspective view of an alternate version of heat sink.

Another version of heat sink is shown in FIG. 5. This heat sink comprises two U-shaped members 30 and 32 which may be assembled together during installation of the heat sink around switch housing 2. Wall 30*a* of member 30 is provided with openings 30*b* which align and receive bosses 2*f* upon assembly. Similarly, wall 32*a* of member 32 has holes 32*b* which align and receive similar bosses 2*f* on the opposite side of housing 2. The forward walls 30*c* and 32*c* have complementary T-shaped openings and projections 30*d* and 32*d*, respectively, which interlock to join walls 30*c* and 32*c* together as a single commonly aligned forward wall. When so positioned, rear wall 30*e* overlaps rear wall 32*e* and holes 30*f* and 32*f* align. This heat sink accommodates a power switching semiconductor such as FET 22 on the external surface of wall 30*e*, held thereagainst by a fastener such as a screw, rivet or the like, which passes through openings 30*f* and 32*f* to also secure the two halves of the heat sink together. The specific attachment of the FET and the fastener have not been shown for this version.

Figure 6:
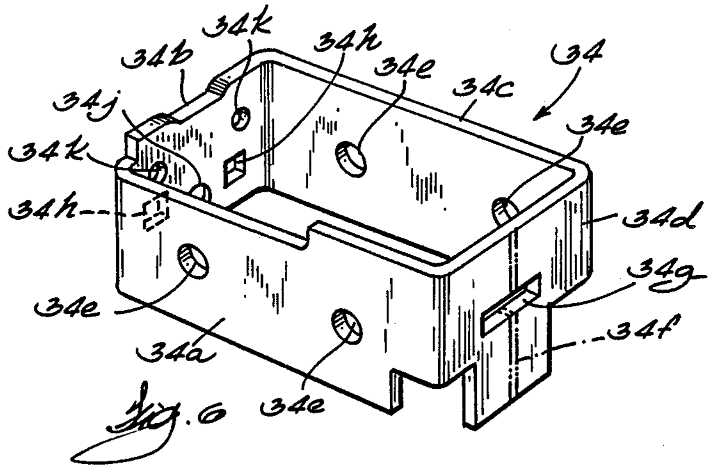
FIG. 6 is a perspective view of an alternate version of heat sink.

FIG. 6 shows another embodiment of heat sink that is contemplated under this invention. Heat sink 34 is a rectangular strap comprising walls 34*a*, 34*b*, 34*c* and 34*d*. Walls 34*a* and 34*c* have respective pairs of holes 34*e* which align with bosses 2*f*, or more generally, are coaxial with the axis of the bosses 2*f* and concentric bosses 2*e*. Wall 34*d* may be split along dotted lines 34*f* to provide a heat sink which is opened and reformed over the switch housing 2 as described for heat sink 20. However, in the following embodiment, wall 34*d* is preferably a solid wall and the heat sink 34 is a continuous, four sided rectangular strap. Wall 34*d* is provided with a rectangular aperture 34*g*. Opposite end wall 34*b* is provided with a pair of rectangular openings 34*h* vertically aligned and transversely spaced at the opposite corners of the wall. Essentially intermediate the rectangular openings 34*h* is a hole 34*j*. Above each of the rectangular apertures 34*h* is a rearwardly extending boss formed by dimples 34*k* struck in the interior surface of wall 34*b*.

Figure 9:
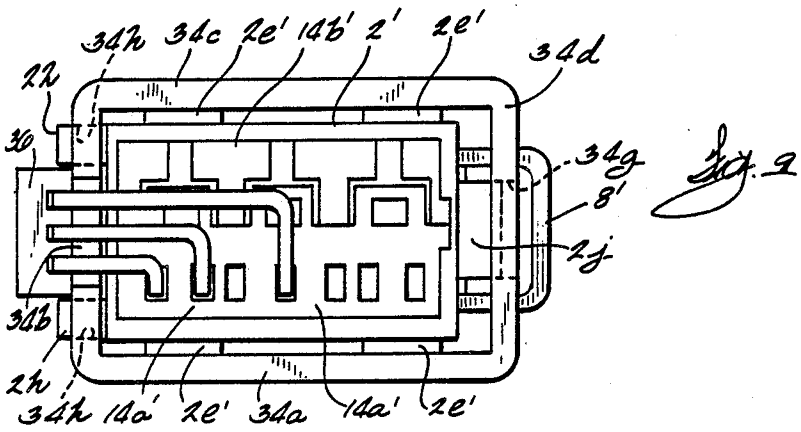
FIG. 9 is a top plan view of the switch of FIGS. 7 and 8.
Figure 7:
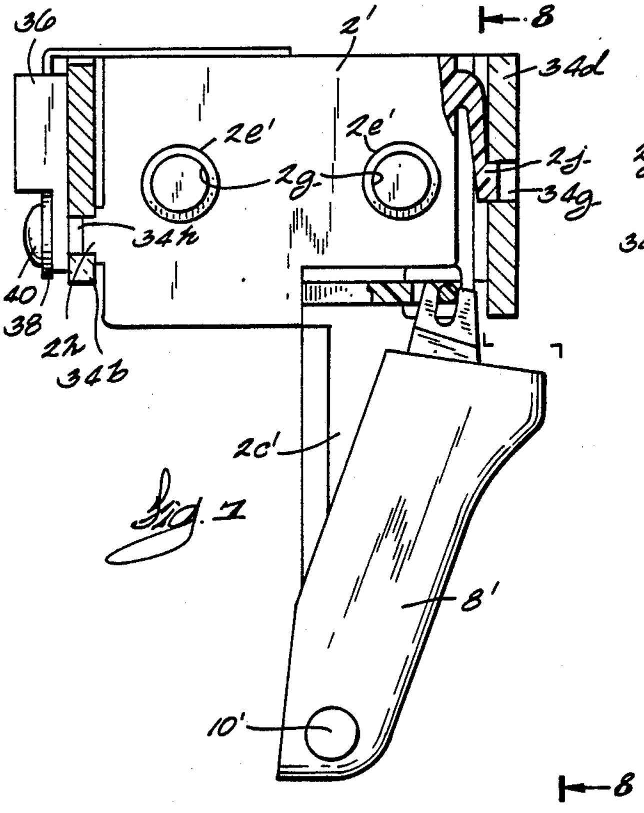
FIG. 7 is a view similar to FIG. 2 showing an alternative embodiment of switch housing and heat sink.
Figure 8:
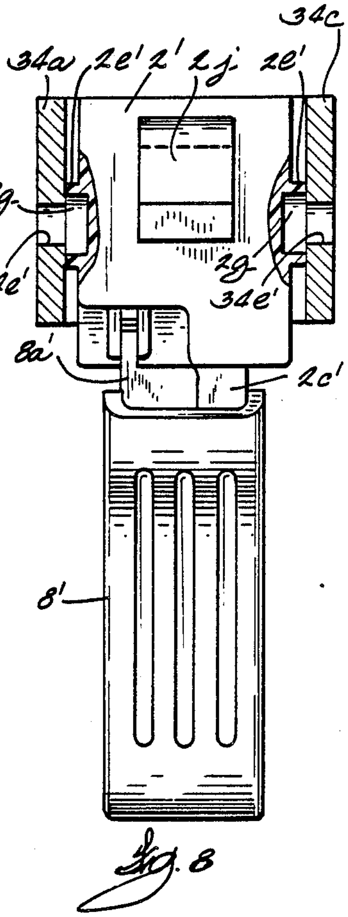
FIG. 8 is a cross sectional view of the switch of FIG. 7 taken substantially along the line 8—8 therein.

Heat sink 34 is used in conjunction with a modified switch housing 2' shown in FIGS. 7–9. Like parts described in conjunction with earlier figures have been given like reference numerals denoted with a prime in FIGS. 7–9. The reduced diameter cylindrical bosses 2*f* are eliminated from switch housing 2' and instead the disc-like bosses 2*e'* are provided with concentric cylindrical recesses 2*g*. Heels 2*d* have been eliminated and instead, rearwardly extending stepped projections 2*h* are provided at the opposite corners of housing 2'. The forward end of housing 2' is provided with a resilient cantilevered finger 2*j* formed integral with the housing 2'. In the switch of this embodiment, the switch housing 2' is nested in the rectangular heat sink 34 by depressing the resilient arm 2*j* and inserting the housing 2' into the central area of the heat sink until rectangular projections 2*h* enter rectangular openings 34*h* of heat sink 34 and the distal end of finger 2*j* snaps into rectangular aperture 34*g* of heat sink 34. In this embodiment, a power switching semiconductor device such as an FET 36 is attached to heat sink 34 after the switch housing 2' is in place. To this end, a washer 38 and screw 40 (FIG. 7) are threaded into hole 34*j* of wall 34*b* from the exterior thereof to clamp FET 36 against the external surface of wall 34*b*. FET 36 has three formed flat strip leads which extend upwardly, then forwardly and subsequently laterally and downwardly to enter the appropriate wire terminal holes for connection of the FET device to the switch as seen in FIG. 9. The battery clips 16 can be added at the time of assembly of switch housing 2 into heat sink 34 and battery clip 16.

Figure 3:
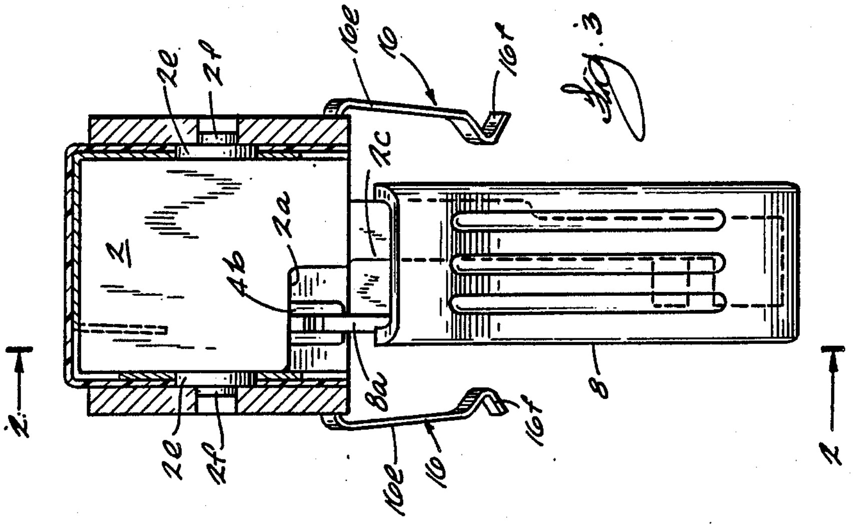
FIG. 3 is a partial cross sectional view taken along the line 3—3 in FIG. 2.

Referring to FIGS. 3 and 8, it will be noted that bosses 2*f* extend only part way into holes 20*e* of heat sink 20 and that cylindrical bosses 2*e'* and the cylindrical recesses 2*g* therein align with openings 34*e* of heat sink 34. Accordingly, the external portions of openings 20*e* and 34*e* may be engaged by appropriately positioned bosses in the tool housing to position the switch within that housing. Commonly, bosses 2*e* or 2*f* or recesses 2*g* are utilized to engage suitable formations on the tool housing to mount the switch. Thus the provision of an external heat sink does not interfere with mounting the switch in the tool housing.

The foregoing has described a speed control switch having an improved heat sink which surrounds the entire housing of a completely insulated, self-contained switch housing, locating the power switching semiconductor externally of the switch housing and away from the internal switch components. Moreover, the heat sink is utilized to readily and inexpensively clamp battery clips to the switch assembly. It is to be understood that the preferred embodiment and various modifications shown and described herein are susceptible of various further modifications without departing from the scope of the appended claims.

I claim:

1. Control apparatus supplying variable electric power to a load comprising, in combination:

a switch comprising an insulating housing, an operator carried by said housing operable through a range of positions, and circuit means responsive to respective positions of said operator connecting, disconnecting and controlling said power to said load, said circuit means comprising a power switching semiconductor disposed externally of said switch housing;

a heat sink comprising a substantially rectangular band circumscribing said housing, said semiconductor being attached to said heat sink;

positioning means on said heat sink and said housing cooperably engaged securely positioning said heat sink to said housing; and a pair of battery clips clamped against said housing by said heat sink, said clips having electrical connection with said switch and extending from between said housing and said heat sink in a cooperatively aligned arrangement defining spring terminals for connection with terminals of a battery.

2. The control apparatus defined in claim 1 wherein said positioning means on said heat sink are provided on an opposed pair of walls of said heat sink.

3. The control apparatus defined in claim 2 wherein at least one wall of said opposed pair of walls is initially angularly displaced from a final position defining said rectangular band, said switch housing is positioned within said rectangular band cooperably engaging said positioning means at another wall of said opposed pair of walls and said housing, and said angularly displaced wall is subsequently moved into said final position cooperatively engaging said positioning means thereon and said housing.

4. The control apparatus defined in claim 3 wherein said positioning means comprises projections and apertures receiving said projections.

5. The control apparatus defined in claim 4 wherein said heat sink comprises four contiguous walls, a fourth wall being split and at least a portion of said fourth wall being contiguous with said angularly displaced wall.

6. The control apparatus defined in claim 1 wherein said heat sink comprises two three-sided bands each having a side wall having apertures comprising first elements of said attachment means and first and second end walls arranged at right angles to said side wall, said housing having projections at opposite sides thereof comprising second elements of said attachment means, said heat sink bands being positioned against said switch housing to effect cooperable engagement of said projections in said apertures, and respective said first end walls extending toward each other and being secured together in an abutting relation, and respective second end walls extending toward each other and being joined together in overlapped relation.

7. The control apparatus defined in claim 1 wherein said heat sink comprises four contiguous walls defining a rectangular box-like opening.

8. The control apparatus defined in claim 7 wherein at least some of said attachment means comprise snap-in cooperable elements.

9. The control apparatus defined in claim 7 wherein at least some of said attachment means comprise a resilient element which is deflected upon insertion of said switch housing into said central opening and restores to engage a respective cooperable element of said attachment means with a snap-action.

10. Control apparatus supplying variable electric power to a load comprising, in combination:

a switch comprising an insulating housing, an operator carried by said housing operable through a range of positions, and circuit means responsive to respective positions of said operator connecting, disconnecting and controlling said power to said load, said circuit means comprising a power switching semiconductor disposed externally of said housing;

a heat sink comprising a substantially rectangular band circumscribing said housing externally thereof, said semiconductor being attached to said heat sink;

means on said heat sink and said housing cooperably engaged securing said heat sink to said housing; and a pair of battery clips disposed between said heat sink band and respective sides of said switch housing, said clips comprising means having electrical connection with wiring terminals of said switch and spring blade portions extending from between said housing and said heat sink band in a cooperatively aligned arrangement defining spring terminals for connection with opposite terminals of a battery.

11. The control apparatus defined in claim 10 wherein said battery clips and said sides of said switch housing comprise complementary structural shapes which interlock said battery clips against movement in a plane of a side of said switch housing when held against said side by said heat sink band.

12. The control apparatus defined in claim 11 wherein said means having electrical connection with said wiring terminals comprises an arm integral with each respective clip extending along an exterior surface of said switch housing and having a prong at a distal end extending into a press-in terminal opening in said switch housing and engaging said press-in terminal.

13. The control apparatus defined in claim 12 further comprising electrical insulation disposed between said heat sink band and each said battery clip.

14. The control apparatus defined in claim 13 wherein said electrical insulation comprises a sheet having similar structural shapes to said battery clips wherein said insulation is also interlocked against movement in a plane of a side of said switch housing by said complementary shapes on said housing.

15. The control apparatus defined in claim 14 wherein said electrical insulation comprises a single U-shaped sheet overlying said exterior surface of said switch housing and the respective arms of said battery clips, and extending alongside opposite sides of said switch housing between said heat sink band and said battery clips.

16. Control apparatus supplying variable electric power to a load comprising, in combination:

a switch comprising an insulating housing having top, bottom, right, left, front and rear sides, an operator depending from said bottom side having means extending into said housing and being operable through a range of positions, and circuit means responsive to respective positions of said operator connecting, disconnecting and controlling power to said load, said circuit means comprising a power switching semiconductor disposed exteriorly of said switch housing;

a heat sink comprising a substantially closed-loop metal band defining a central opening therethrough in which said switch housing is disposed, said band circumscribing said right, left, front and rear sides of said housing, said semiconductor being secured to said metal band; and positioning means on said switch housing and said heat sink cooperable to securely position said housing within said heat sink, said positioning means comprising spacer means providing space between said housing sides and said heat sink open at top and bottom edges of said heat sink.

17. The control apparatus defined in claim 16 wherein said positioning means comprises holes in said metal band heat sink and projections on said switch housing extending into said holes.

18. The control apparatus defined in claim 17 wherein at least one of said projections comprises a resilient member affording snap-in attachment of said heat sink and said switch housing.

19. The control apparatus defined in claim 17 wherein said projections on said switch housing extend part way into said holes, and said holes further operate as locating means receiving projections of an enclosure to which said control apparatus is mounted.

* * * * *